United States Patent
Ihde

(10) Patent No.: US 11,925,008 B2
(45) Date of Patent: Mar. 5, 2024

(54) METHODS AND APPARATUS FOR MULTI-DIRECTIONAL FAN

(71) Applicant: Illinois Tool Works Inc., Glenview, IL (US)

(72) Inventor: Jeffery R. Ihde, Greenville, WI (US)

(73) Assignee: Illinois Tool Works Inc., Glenview, IL (US)

( * ) Notice: Subject to any disclaimer, the term of this patent is extended or adjusted under 35 U.S.C. 154(b) by 666 days.

(21) Appl. No.: 16/670,097

(22) Filed: Oct. 31, 2019

(65) Prior Publication Data

US 2020/0130096 A1 Apr. 30, 2020

Related U.S. Application Data

(60) Provisional application No. 62/753,231, filed on Oct. 31, 2018.

(51) Int. Cl.
| | |
|---|---|
| H05K 7/20 | (2006.01) |
| B23K 9/10 | (2006.01) |
| B23K 9/32 | (2006.01) |
| B23K 11/28 | (2006.01) |

(52) U.S. Cl.
CPC ..... *H05K 7/20909* (2013.01); *H05K 7/20172* (2013.01); *H05K 7/20945* (2013.01); *B23K 9/1006* (2013.01); *B23K 9/32* (2013.01); *B23K 11/28* (2013.01)

(58) Field of Classification Search
CPC .................................................... B23K 3/085
See application file for complete search history.

(56) References Cited

U.S. PATENT DOCUMENTS

| | | | | | |
|---|---|---|---|---|---|
| 3,958,429 | A  | * | 5/1976  | Kirsch   | F25B 49/027 62/DIG. 17 |
| 5,215,834 | A  | * | 6/1993  | Reher    | H01M 10/625 429/61 |
| 7,520,444 | B1 | * | 4/2009  | Hall     | H05K 7/206 236/49.3 |
| 2006/0138247 | A1 | * | 6/2006  | Shen     | G06F 1/203 236/49.3 |
| 2007/0034617 | A1 | * | 2/2007  | Oyama    | H05K 7/20909 219/130.1 |
| 2009/0101630 | A1 | * | 4/2009  | Trinkner | H02K 7/02 219/133 |
| 2010/0089714 | A1 | * | 4/2010  | Takada   | B65H 3/0669 192/43 |
| 2012/0321475 | A1 | * | 12/2012 | Gardas   | F04D 29/646 416/207 |
| 2017/0342988 | A1 | * | 11/2017 | Marcant  | F01P 7/02 |

* cited by examiner

*Primary Examiner* — Mukundbhai G Patel
(74) *Attorney, Agent, or Firm* — McAndrews, Held & Malloy, Ltd.

(57) ABSTRACT

Disclosed is an engine driven power supply that includes a housing having a first area that includes an engine and a second area that includes a temperature sensitive component. A fan is configured to force air in multiple directions through the housing. A temperature sensor to measure a temperature. And a controller controls the fan to force air in a first direction into the first area when the temperature exceeds a first threshold temperature value, and controls the fan to force air in a second direction into the second area when the temperature is below the first threshold temperature value.

17 Claims, 3 Drawing Sheets

METHODS AND APPARATUS FOR MULTI-DIRECTIONAL FAN

RELATED APPLICATIONS

This patent claims priority to U.S. Provisional Patent Application Ser. No. 62/753,231, filed Oct. 31, 2018, entitled "Methods and Apparatus for Multi-Directional Fan." The entirety of U.S. Provisional Patent Application Ser. No. 62/753,231 is incorporated herein by reference.

BACKGROUND

Welding is a process that has become ubiquitous in various industries and applications, such as construction, ship building, and so forth. Welding power supplies are constructed with a housing to protect internal electrical components. Welding systems operate at high power levels which results in internal components reaching elevated temperatures. In order to cool the internal components, fans have been incorporated into the welding power supply to introduce airflow over the electrical components. However, such systems are inefficient and limited in scope, which can lead to damaging of and/or shortening the life of certain components of the power supply. Thus, a system to reduce power consumption, provide targeted cooling of internal electronics, and mitigate exposure to environmental hazards is desirable.

SUMMARY

Methods and systems are provided for a welding-type power supply employing a multi-directional fan, substantially as illustrated by and described in connection with at least one of the figures, as set forth more completely in the claims. In particular, the operation of the multi-directional fan, including the direction of forced airflow, is determined and controlled based on a temperature measurement compared against a list of threshold temperature values and/or a welding parameter of the welding-type power supply.

DETAILED DESCRIPTION

Figure 1:
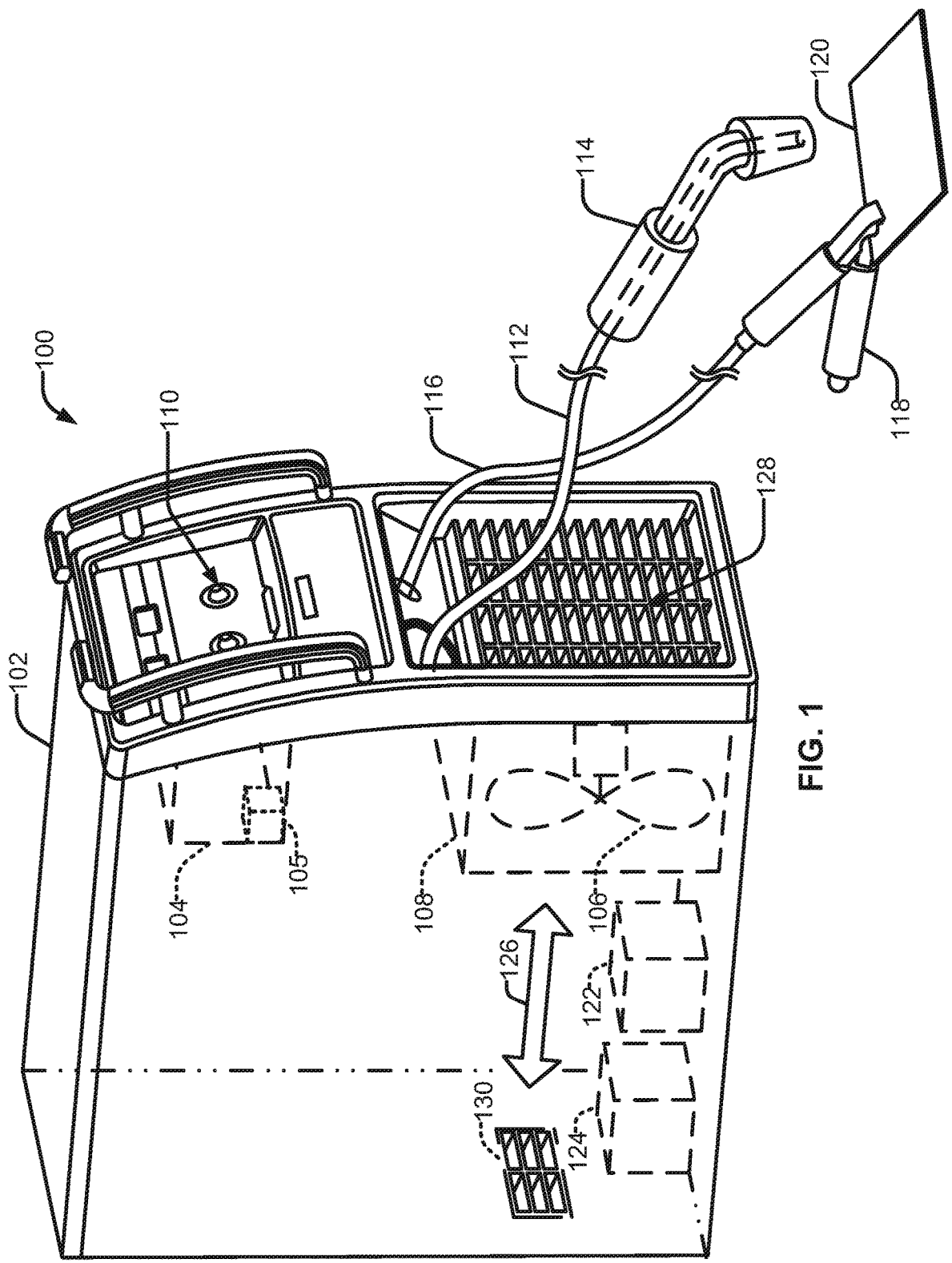
FIG. 1 is an example system that includes a welding-type power supply employing a multi-directional fan, in accordance with aspects of this disclosure.

Methods and systems are provided for controlling a multi-directional fan in a welding-type power supply based on one or more variables, such as temperature. Disclosed examples of the welding system are configurable such that a controller (e.g., software, hardware, or a combination of software and hardware) controls a direction of airflow from the multi-directional fan. The use of a multi-directional fan and configurable control results in the economical use of power, less variation in component temperature, and a reduction in noise of the overall system.

Some welding-type systems employ an integrated fan (e.g., a 24V muffin fan) for cooling internal components. However, such fans were configured to run continuously and in a single direction, which increases the amount of energy needed to cool a variety of components and generates unnecessary noise.

In disclosed examples, a fan is provided that is capable of operating over a range of directions, controlled in response to an environmental temperature, and/or one or more internal welding-type power supply temperatures. Thus, the operation of the fan (e.g., a direction of forced airflow from the fan) is determined based on a temperature related to the operation of the welding-type system.

Example welding operations for the welding-type system include process type (e.g., MIG, TIG, plasma, induction heating, etc.), electrode type, electrode diameter, wire feed speed, cable inductance, workpiece material thickness, power output, preheating, cutting operations, and other similar operations. Thus, the fan is configured to operate over various directions to provide airflow through the welding-type system and temperature sensitive components therein.

In an example, the direction of the fan is controlled by adjusting the polarity of a power input to a fan, thereby reversing the fan direction. In some examples, for known weld parameters (e.g., a particular process type), a set of operating values can be determined, such as system output and input, voltage and current levels, etc. When the welding-type system operates within one or more parameters, the operation of the fan, including direction and/or fan speed, can be selected and/or adjusted in response to provide an appropriate level of cooling. For instance, a list of values associated with historical data regarding heat outputs from system components, the component's location within the system, the component's sensitivity to extreme temperatures, as well as threshold values and/or ranges to inform the system via the controller, to control the fan to provide forced air.

By contrast, conventional fans run in a single direction, typically at a maximum speed, and are activated in response to the welding-type power switch being turned on, and continue to run in the single direction at the single speed until the power switch is turned off. Fans can be activated in response to one or more temperature sensors, such that when an upper-temperature threshold is reached the fan turns on, and the fan turns off when a lower temperature threshold is met. In each case, the fan operates at full speed when activated.

As disclosed herein, the multi-directional fan is controlled based on temperature values associated with the system, be it a component, an ambient temperature within a system housing, an environmental temperature, a stored value associated with an expected temperature, and/or one or more weld parameters. In operation, the fan selects a direction for forced air through the system in order to provide adequate cooling, instead of running in a single regardless of temperature and/or operating conditions as in conventional systems. Running the fan through variable directions improves the functionality of temperature sensitive components, and increases system efficiency. Additionally, operating the fan over variable speeds can reduce power consumption. Further, the system is kept clean and in good operating condition, as fewer contaminants are unnecessarily drawn into the system (i.e. as opposed to directing forced air into the system even as operating conditions change), which decreases maintenance requirements and improves system reliability.

In the present disclosure, activation of the fan and the particular direction of forced air from the fan is dynamically controlled in response to one or more temperatures, and/or one or more welding parameters. In some examples, the fan is configured to operate at all times during the welding process, but in a varying direction selected in accordance with particular temperature profiles of internal areas or zones within the housing. As a result, the fan consumes less power and is more responsive and efficient system compared to other controls.

In some examples, a thermal model can be developed based on historical data gathered during operation of the system, including temperature and/or operating values (e.g., operating time, output, etc.). The fan controller can incorporate the thermal model to affect adequate cooling of the system by introducing air in a variety of directions within the housing. In some examples, the direction of airflow is adjusted in response to different temperature levels measured at varying locations within and/or outside of a system housing, and can be determined empirically and stored in a memory device accessible by the controller. The controller can access the memory to determine an appropriate fan direction and/or speed corresponding to a measured temperature and the relative location. For instance, a selected welding parameter may correspond to a particular need for airflow at a location within the housing, but the environmental conditions may have resulted in a different operating temperature that may change the need for airflow. In such a case, the controller may adjust the direction of the fan to enhance or limit the cooling effect from the airflow.

In disclosed examples, a welding-type power supply includes a housing with a fan therein configured to force air in multiple directions. A temperature sensor measures a temperature, and a controller controls the fan to force air in a first direction when the temperature exceeds a first threshold temperature value. The controller also controls the fan to force air in a second direction when the temperature is below the first threshold temperature value.

In some examples, the first direction is opposite the second direction. In examples, the controller is further configured to access a plurality of threshold temperature values and compare the temperature to the plurality of threshold temperature values. In some examples, the first direction forces environmental air into the housing.

In examples, the second direction forces air from a first area of the housing to a second area of the housing. In some examples, the housing includes a duct configured to channel airflow to or from the fan. I some examples, an electrical component located within the housing, the duct configured to force air toward or away from the electrical component in response to the temperature.

In some examples, an engine is located within the housing, wherein the duct is configured to direct air heated by the engine toward the electrical component when the fan is forcing air in the second direction. In examples, the duct changes position to channel airflow in a plurality of directions, the controller commands the duct to adjust position based on the measured temperature.

In examples, the controller commands the duct to adjust to a first position to channel airflow from the first area of the housing to the second area of the housing, and to adjust to a second position to channel airflow from the first area of the housing to a third area of the housing.

In some examples, an engine is located within the housing, and an engine temperature sensor is configured to measure a temperature of the engine during operation, the controller further controls the direction of the fan based on the engine temperature.

In examples, the fan is configured to operate at multiple fan speeds based on the measured temperature. In some examples, the fan operates at a first speed between the first threshold temperature and a second threshold temperature greater than the first threshold temperature, and to operate at a second speed when the environmental temperature exceeds the second threshold temperature.

In disclosed examples, an engine driven power supply includes a housing having a first area that includes an engine and a second area that includes a temperature sensitive component. A fan is configured to force air in multiple directions through the housing. A temperature sensor to measure a temperature. And a controller controls the fan to force air in a first direction into the first area when the temperature exceeds a first threshold temperature value, and controls the fan to force air in a second direction into the second area when the temperature is below the first threshold temperature value.

In some examples, the fan is driven by an electric fan motor. In examples, the controller controls a direction of the forced air by changing a polarity of a power input to the fan motor. In some examples, a mechanical device associated with the fan is configured to change a direction of the forced air by changing a position of the mechanical device. In examples, the fan includes an adjustable fan blade, wherein the mechanical device is configured to adjust an angle of the fan blade based on the temperature, wherein a first angle corresponds to the first direction and a second angle corresponds to the second direction.

In examples, the mechanical device is a clutch configured to force air in the first direction when engaged with the fan and to force air in the second direction when disengaged from the fan. In some examples, a duct is configured to channel air heated by the engine from the first area to the second area to heat the temperature sensitive component when the fan is forcing air in the second direction.

Welding-type power, as used herein, refers to power suitable for welding, plasma cutting, induction heating, air carbon-arc cutting and/or gouging (CAC-A), cladding, and/or hot wire welding/preheating (including laser welding and laser cladding), including switched mode power supplies, converters, choppers, resonant power supplies, quasi-resonant power supplies, etc., as well as control circuitry and other ancillary circuitry associated therewith.

In an example illustrated in FIG. 1, a welding-type system 100 includes a welding-type power supply 102 to operate one or more welding-type tools, such as a welding-type torch 114, and a power return clamp 118, to perform a welding operation on a workpiece 120. The welding-type power supply includes a controller 104 operatively connected to a multi-directional fan 106. On or more user interfaces 110 can be used to provide information to the controller 104. The fan 106 can be within a frame 108 to protect the fan 106 and/or channel airflow during operation. The fan 106 can introduce environmental air into the welding-type power supply 102 through one or more grates or louver panels 128 and 130. Air 126 flowing within the welding-type power supply 102 (e.g., through a channel, duct, the interior housing of the power supply 102, a wind tunnel, etc.) serves to cool internal components 122, 124, in accordance with the examples provided herein.

While the illustrated example shows the internal components 122, 124 directly in the path of the airflow, in other examples the internal components are thermally coupled to heat sinks or other components within the power supply 102. Furthermore, one or more ducts or other features may be provided to direct airflow to or from a particular component 112, 124, in response to a temperature measurement and/or other variable.

The fan 106 can operate over a range of possible directions based on one or more temperature measurements, such as from a temperature sensor 105. For example, during a welding operation, a high power output may be required, causing the internal components 122, 124 to heat up. Based on a measured temperature and/or a list of values stored in the controller 104 and associated with the particular welding operation, the controller 104 can control the fan to vary the direction of airflow. Therefore, the fan 106 operates to focus airflow to needed components/areas within the power supply 102, including limiting or preventing airflow over certain component/areas, thereby efficiently responding to changing temperatures, welding parameters and conditions.

In some examples, the fan 106 is configured to introduce environmental air into a housing of the power supply 102, such as when internal temperatures are elevated above a threshold level, and the environmental temperature is relatively low. In other examples, the fan 106 can reverse direction, thereby exhausting air from within the power supply 102 into the environment. In examples, the fan 106 can adjust a direction of the airflow, such as an angle of flow and/or toward a particular component or area, to circulate air within the power supply 102 to balance zone temperatures within the housing. In some examples, the fan 106 may be two or more fans, such as a first fan to create airflow in a first direction and a second fan to drive airflow in a second direction, in addition or alternative to a single multi-directional fan.

As shown in FIG. 1, the welding-type torch 114 is connected to the welding-type power supply 102 suitable for powering welding operations via a welding-type cable 112, and the power return clamp 118 is connected via a welding-type cable 116. The welding torch 114 may be a torch configured for stick welding, tungsten inert gas (TIG) welding, metal inert gas (MIG), gas metal arc welding (GMAW), or other torch types, based on the desired welding application. Additional welding-type tools are also contemplated, such as an induction heating device, a plasma cutting torch, etc. (not shown). In some examples, the system 100 may be coupled to other devices, such as a wire feeder, an induction heater, a plasma cutter, a power generator, a compressor, or any combination thereof.

In determining the appropriate fan direction and/or fan speed, additional or alternative factors can be considered. For example, the fan 106 can operate at a given direction and/or speed upon receipt of an activation signal (e.g., a welding arc is triggered, a temperature threshold level is exceeded, etc.), or selection of a particular operating direction via the interface 110. In some examples, the fan 106 can operate at a given direction in advance of a welding operation in order to pre-cool internal components, such as when a selected operation requires a high power output, and/or the temperature measurement is high.

In some examples, the fan 106 forces airflow 126 along a path adjacent one or more electrical components of the power supply 102. As shown in FIG. 1, the air 126 flows through the interior of the power supply 102 for substantially the entire length of the enclosure, entering the interior of the power supply 102 through louvers 128 and/or 130 on one or more panels of the power supply 102. The louvers 128, 130 can be constructed into the front and rear panels to accommodate airflow through the power supply 102.

Figure 2:
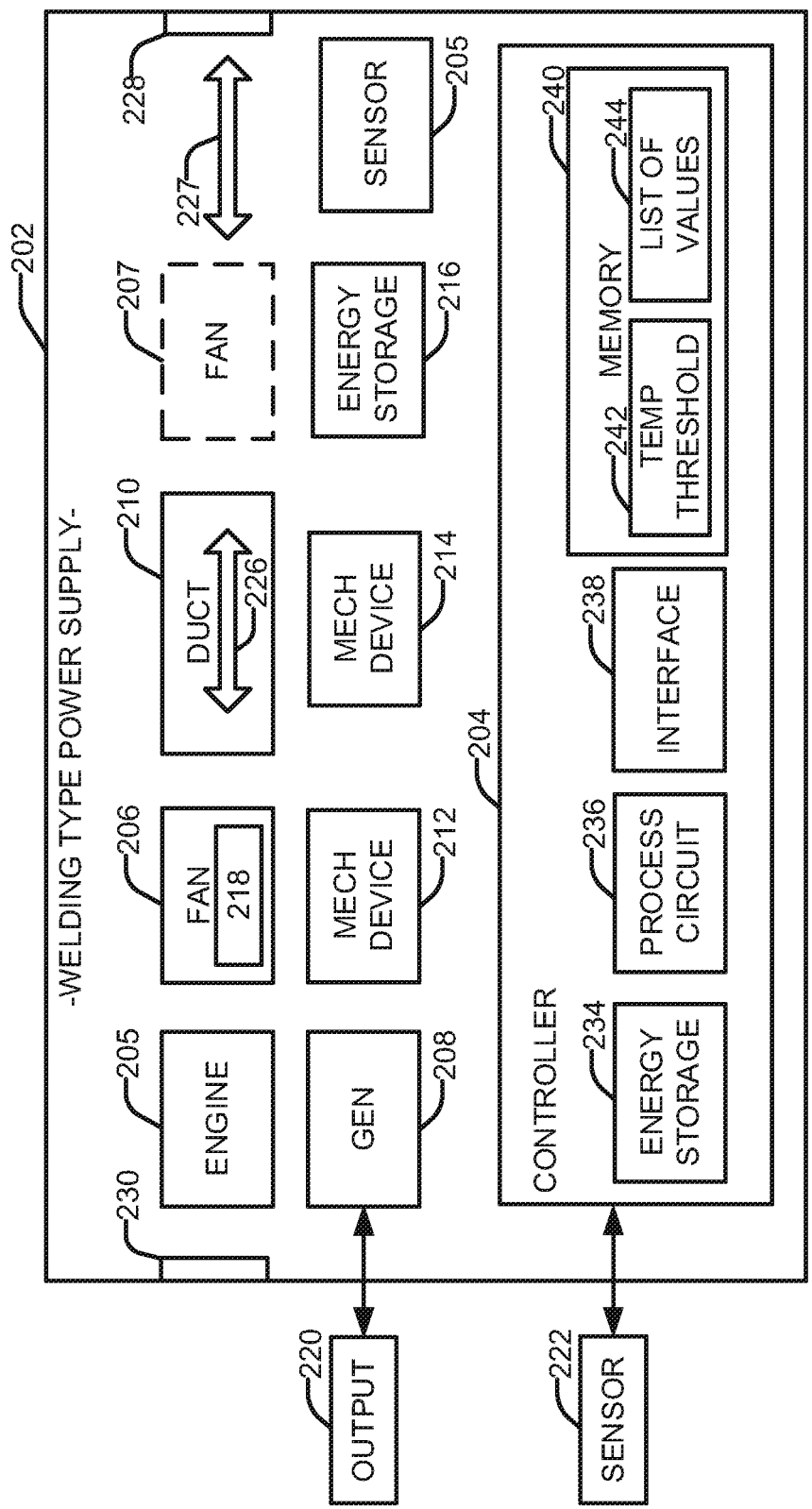
FIG. 2 is a block diagram of an example implementation of a welding-type power supply, in accordance with aspects of this disclosure.

FIG. 2 shows a block diagram of an example welding-type power supply 202. As shown, the power supply 202 can include an engine 205 connected to an electrical generator 208 to generate power for an output 220 to provide welding-type power, etc. An energy storage device 216 can be included to supplement power from the generator 208 for output 220 and/or supply power for other components. A fan 206, as well as one or more optional fans 207, can be located within the power supply 202. For instance, the fan(s) 206, 207 can be arranged to maximize airflow within a housing of the power supply 202, direct airflow to areas and/or components that are subject to temperature extremes/sensitivity. One or more air inlets 228, 230 can be located around the power supply 202 to allow environmental air to flow into the power supply 202 as well as allow air from within the power supply 202 to be exhausted, depending on temperature measurements, welding operation, and/or other factors.

A controller 204 includes one or more of an energy storage device 234, a processing circuit 236, and a communications interface 238 to transmit information to and receive information from one or more devices. The controller 204 further includes a memory 240 which contains a matrix or other listing of multiple values (e.g., list of values 242), as well as a matrix or other list of temperature thresholds 244. The interface 238 can be operatively connected to a user interface 230 (e.g., interface 110), the multi-directional fan, and one or more internal sensors 205, one or more external sensors 222 (which may be located on the interior or exterior surface of the power supply 202), such as temperature sensors.

As described herein, the controller 204 controls the fan(s) 206, 207 to operate during periods of elevated temperature (e.g., during operation of the welding-type power supply 202) in a range of directions in response to measured temperatures and/or welding parameters. The example controller 204 of FIG. 2 controls the operations of the power supply 202 (and in some examples, the system 100 of FIG. 1) and may be a general-purpose computer, a laptop computer, a tablet computer, a mobile device, a server, and/or any other type of processing circuit 236 or computing device integrated with or remote from the power supply 102. In some examples, the controller 204 is implemented in a cloud computing environment, on one or more physical machines, and/or on one or more virtual machines.

The controller 204 may receive input from the one or more interfaces 238 through which the power supply 202 receives commands from, for example, an operator (e.g., a welder) or computing platform. In some examples, the operator may employ the user interface 238 to choose a welding process (e.g., stick, TIG, MIG, etc.) and desired operating values of the power supply 202 (e.g., voltage, current, etc.). The interface 238 can be configured for inputting commands and/or customizing controls, such as temperature thresholds, welding processes, and other commands via a control interface (e.g., graphical user interfaces (GUI), touch screens, communication pathways, etc.). The controller 204 may be configured to receive and process a plurality of inputs regarding the performance and demands of the system 100.

The controller includes a memory device 240 which may be volatile or non-volatile memory, such as ROM, RAM, magnetic storage memory, optical storage memory, or a combination thereof, and may be integrated with the controller 204, located remotely, or a combination of the two. In addition, a variety of control parameters may be stored in the memory device 240 along with code configured to provide a specific output during operation (e.g., automatic control of the fan(s) 206, 207 direction when a threshold temperature level has been crossed).

For example, the controller 204 is configured to access a memory 240 storing the list of values 242. In some examples, the controller 204 and the memory 240 are integrally located (e.g., within a computing device). In some examples, the controller 204 is connected to a network interface to access the list of values 242 via a communications network.

The controller 204 is configured to execute a process employing one or more temperature sensors 205, 222, applied to the temperature threshold values 242 and/or list of values 244, to determine a desired fan direction. The controller 204 compares the one or more welding parameters against a list of values stored in the memory device 240, which can then be used to adjust the fan direction and/or speed to provide a desired cooling effect the power supply 202. For example, the controller 204 may utilize a look-up table, an algorithm, and/or a model stored in the memory device 240 to determine the fan direction and/or speed based on a relationship between the variables and the values stored in memory. The controller 204 can then adjust the fan direction in accordance with the corresponding threshold temperature. For instance, the one or more sensors 205, 222 can be arranged about the power supply 202 in predetermined locations known to the controller 204. If a particular temperature sensor provides a measurement that exceeds a threshold temperature value (i.e. determined based on proximity to heat generating components such as the engine 205, or heat sensitive components such as the controller 204), the controller 204 can activate one or more fan(s) 206, 207 to direct airflow toward or away from the particular area in which the sensor resides. In some examples, a sensor is included with the engine 205, such that the internal and/or proximate temperature of the engine can be directly measured.

In order to adjust the direction of the airflow (e.g., airflow 227, 226) from fan(s) 206, 207, one or more adjustment devices can be included. For example, a mechanical device 212 such as a motor and/or clutch can be controlled by the controller 204 to rotate or otherwise adjust an angle of the fan(s) 206, 207 to direct the airflow to a desired area within the housing of the power supply 202. For instance, a mechanical device 218 can include an electric fan motor or other device, which can activate the rotational movement of the fan blades. In these examples, changing polarity of the electric fan motor would cause the fan to reverse direction, as disclosed herein. In some examples, blades of the fan can be adjusted by the mechanical device 218, in length, width, pitch, separation distance, etc., to adjust the airflow direction. The volume and/or speed of such airflow can also be adjusted by mechanical devices 212, 218.

For known temperature values and associated welding operations, certain desired temperature ranges for components can be estimated. For example, a particular temperature level may correspond to a particular welding parameter, such as power output and input, voltage and current levels, or a range of levels. Based on these estimated temperature ranges, directed airflow required for adequate cooling are then determined empirically for the temperature levels within the range. In some examples, the controller 204 is configured to determine and/or estimate a temperature based on inputs from multiple sensors, thereby determining a desired airflow from the fan based on the level of heat sensitivity and/or proximity to other components associated with a corresponding welding operation.

By contrast to fans which are only activated and deactivated to run at maximum speed based on high and low-temperature thresholds, the described multi-directional fan is capable of cooling various welding components (e.g., components 122, 124 of FIG. 1) in response to changes in the environment inside and outside the power supply 202. The additional use of welding parameters enables predictive cooling, such as directing airflow from the fan to a particular area of the housing prior to reaching a temperature threshold and/or reducing cooling more quickly after a weld operation has ended, if a threshold delay until a next welding operation can be predicted.

As a result, components within a welding-type power supply employing the multi-directional fan reach shutdown temperature limits faster by taking less time to cool to ambient temperatures when compared to fans cannot adjust the direction of airflow. For systems that employ switched mode power supply technologies, which include semiconductors and smaller sized transformers, cooling times are reduced as compared to transformer based machines with larger, magnetic components. Moreover, with a multi-directional fan, the internal components operate at a more constant temperature, making them less subject to large changes in temperature, thereby increasing the life of the components and the system.

In an example, the controller (e.g., a control circuit) is configured to execute a set of instructions to control the fan to change the direction of airflow, in response to a temperature sensor measurement compared against one or more temperature thresholds. In some examples, the controller 204 is configured to identify a location of the temperature sensor and/or a source of the heat (e.g., via one or more captured variables associated with a particular component, such as current, etc., corresponding to an increase in heat). Once identified, the controller 204 sends commands to the fan(s) 206, 207 and/or a mechanical device 212, 218 that controls the direction of the fan(s) 206, 207 to adjust the direction of airflow within the power supply 102.

Figure 3:
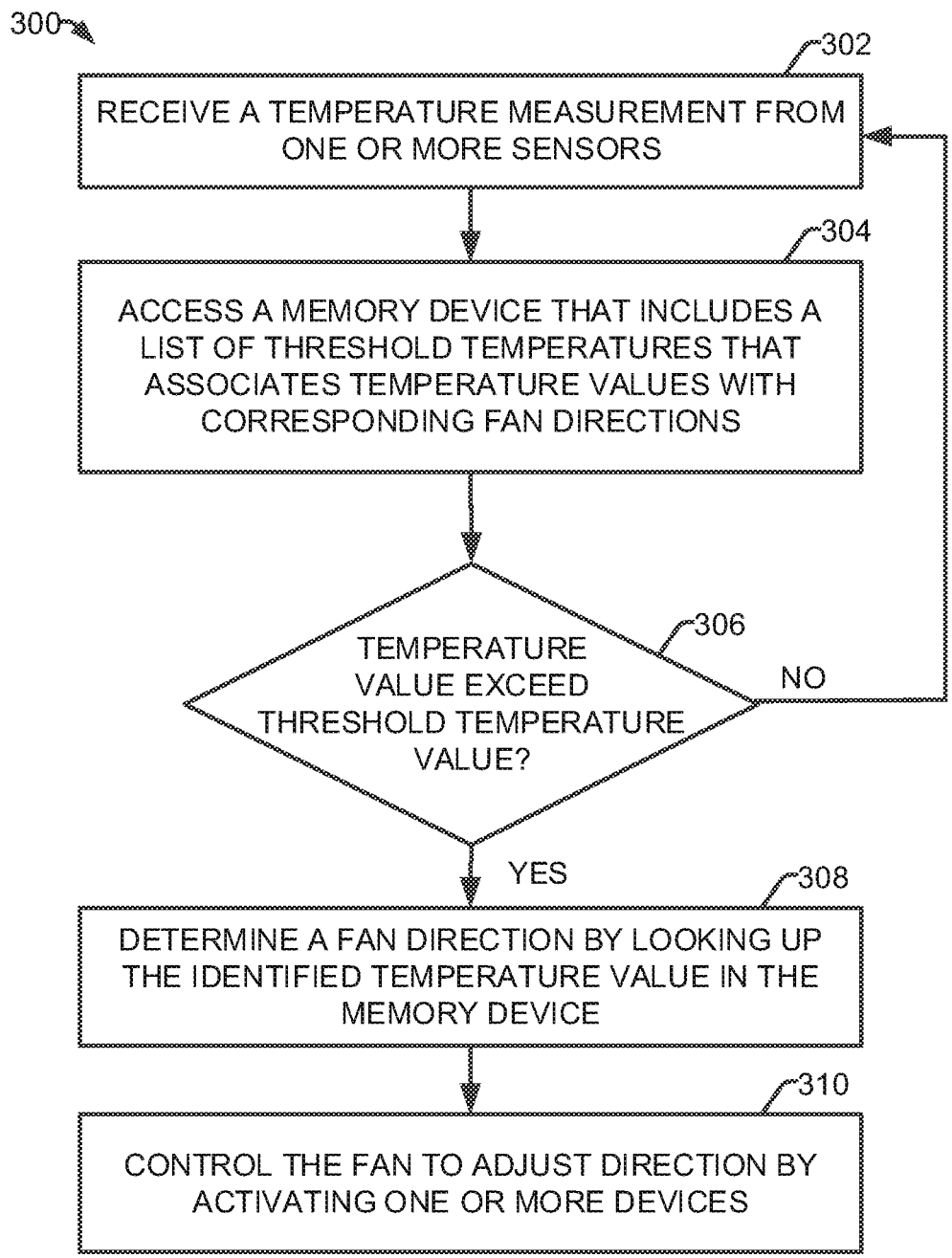
FIG. 3 is a flowchart illustrating example machine readable instructions which may be executed by a processor to implement the controller of FIGS. 1 and 2 to determine and/or control a fan direction based on a welding parameter of a welding-type system.

FIG. 3 is a flowchart illustrating example machine readable instructions 300 which may be executed by a processor (e.g., controller 104 of FIG. 1, controller 204 of FIG. 2) to identify a desired operation (e.g., direction of airflow) for a fan (e.g., fan 106 of FIG. 1, fan(s) 206, 207 of FIG. 2) for a welding-type power supply (e.g., power supply 102 of FIG. 1, power supply 202 of FIG. 2). The example instructions 300 may be stored on any suitable non-transitory machine-readable media, such as memory device 240 described with respect to FIG. 2.

At block 302, the controller receives a temperature measurement from one or more sensors (e.g., sensor of FIG. 1, sensors of FIG. 2). At block 304, the controller accesses a memory device that includes a plurality of values (e.g., list of values 242). For example, the plurality of values can be contained in a matrix or a look-up table that associates temperature measurement values with corresponding airflow priorities and/or fan directions. The plurality of values can similarly include a location of the sensor and/or another component within the power supply, to inform the controller as to a desired direction for airflow to maintain proper cooling.

At block 306, the controller compares the measured temperatures to the list of threshold temperature values, and determines if the measured temperature exceeds or crosses one or more threshold temperature values. If not, the process returns to block 302 to continue monitoring temperature measurements. If a threshold temperature value is crossed or exceeded, in block 308 the controller determines a fan direction by looking up the identified threshold temperature value in the memory device. Having determined the corresponding fan direction, the controller can control the fan (and/or a mechanical device(s) 212, 214) to operate the fan in the determined direction in block 310.

As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations.

The present methods and systems may be realized in hardware, software, and/or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may include a general-purpose computing system with a program or other code that, when being loaded and executed, controls the computing system such that it carries out the methods described herein. Another typical implementation may comprise one or more application specific integrated circuit or chip. Some implementations may comprise a non-transitory machine-readable (e.g., computer-readable) medium (e.g., FLASH memory, optical disk, magnetic storage disk, or the like) having stored thereon one or more lines of code executable by a machine, thereby causing the machine to perform processes as described herein. As used herein, the term "non-transitory machine-readable medium" is defined to include all types of machine-readable storage media and to exclude propagating signals.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. For example, systems, blocks, and/or other components of disclosed examples may be combined, divided, re-arranged, and/or otherwise modified. Therefore, the present method and/or system are not limited to the particular implementations disclosed. Instead, the present method and/or system will include all implementations falling within the scope of the appended claims, both literally and under the doctrine of equivalents.

What is claimed is:

1. A welding-type power supply, comprising:
   a housing comprising a fan configured to force air in multiple directions and a duct configured to channel airflow to or from the fan;
   a temperature sensor to measure a temperature;
   a controller configured to:
      control the fan to force air in a first direction when the temperature exceeds a first threshold temperature value; and
      control the fan to force air in a second direction when the temperature is below the first threshold temperature value; and
   a mechanical device configured to adjust an angle of the fan with respect to the housing to change an angle of at least one of the first direction or the second direction, the controller configured to control the mechanical device based on the temperature sensor.

2. The welding-type power supply of claim 1, wherein the first direction is opposite the second direction.

3. The welding-type power supply of claim 1, wherein the controller is further configured to access a plurality of threshold temperature values and compare the temperature to the plurality of threshold temperature values.

4. The welding-type power supply of claim 1, wherein the first direction forces environmental air into the housing.

5. The welding-type power supply of claim 1, wherein the second direction forces air from a first area of the housing to a second area of the housing.

6. The welding-type power supply of claim 1, further comprising an electrical component located within the housing, the duct configured to force air toward or away from the electrical component in response to the temperature or another welding-type power supply parameter.

7. The welding-type power supply of claim 6, further comprising an engine located within the housing, wherein the duct is configured to direct air heated by the engine toward the electrical component when the fan is forcing air in the second direction.

8. The welding-type power supply of claim 1, wherein the fan is configured to operate at multiple fan speeds based on the measured temperature.

9. The welding-type power supply of claim 8, wherein the fan is configured to operate at a first speed between the first threshold temperature and a second threshold temperature greater than the first threshold temperature, and to operate at a second speed when the environmental temperature exceeds the second threshold temperature.

10. A welding-type power supply, comprising:
    a housing comprising:
       a fan configured to force air in multiple directions; and
       a duct configured to channel airflow to or from the fan, wherein the duct is configured to change position to channel airflow in a plurality of directions, wherein the controller is configured to command the duct to adjust position based on the measured temperature;
    an electrical component located within the housing, the duct configured to force air toward or away from the electrical component in response to the temperature or another welding-type power supply parameter;
    a temperature sensor to measure a temperature; and
    a controller configured to:
       control the fan to force air in a first direction when the temperature exceeds a first threshold temperature value; and
       control the fan to force air in a second direction when the temperature is below the first threshold temperature value.

11. The welding-type power supply of claim 10, wherein the controller commands the duct to adjust to a first position to channel airflow from the first area of the housing to the second area of the housing, and to adjust to a second position to channel airflow from the first area of the housing to a third area of the housing.

12. The welding-type power supply of claim 1, further comprising:
    an engine located within the housing; and an engine temperature sensor configured to measure a temperature of the engine during operation, the controller further configured to control the direction of the fan based on the engine temperature.

13. An engine driven power supply, comprising:
a housing having a first area that includes an engine and a second area that includes a temperature sensitive component, the housing comprising a duct configured to channel air heated by the engine from the first area to the second area to heat the temperature sensitive component when the fan is forcing air in the second direction;
a fan configured to force air in multiple directions through the housing;
a temperature sensor to measure a temperature;
a controller configured to:
  control the fan to force air in a first direction into the first area when the temperature exceeds a first threshold temperature value; and
  control the fan to force air in a second direction into the second area when the temperature is below the first threshold temperature value; and
a mechanical device associated with the fan and configured to adjust an angle of the fan with respect to the housing to change an angle of at least one of the first direction or the second direction of the forced air by changing a position of the mechanical device, the controller configured to control the mechanical device to change the at least one of the first direction or the second direction of the forced air based on the temperature sensor.

14. The welding-type power supply of claim 13, wherein the fan is driven by an electric fan motor.

15. The welding-type power supply of claim 14, wherein the controller is further configured to control a direction of the forced air by changing a polarity of a power input to the fan motor.

16. The welding-type power supply of claim 13, wherein the fan comprises an adjustable fan blade, wherein the mechanical device is configured to adjust an angle of the fan blade based on the temperature, wherein a first angle corresponds to the first direction and a second angle corresponds to the second direction.

17. The welding-type power supply of claim 13, wherein the mechanical device is a clutch configured to force air in the first direction when engaged with the fan and to force air in the second direction when disengaged from the fan.

* * * * *